United States Patent [19]

Andle

[11] Patent Number: 4,670,680
[45] Date of Patent: Jun. 2, 1987

[54] DOUBLY ROTATED ORIENTATIONS OF CUT ANGLES FOR QUARTZ CRYSTAL FOR NOVEL SURFACE ACOUSTIC WAVE DEVICES

[75] Inventor: Jeffrey C. Andle, Dallas, Tex.

[73] Assignee: R. F. Monolithics, Inc., Dallas, Tex.

[21] Appl. No.: 891,235

[22] Filed: Jul. 29, 1986

[51] Int. Cl.$^4$ .................................................. H01L 41/08
[52] U.S. Cl. ................................... 310/313 A; 310/261
[58] Field of Search ........... 310/313 R, 313 A, 313 B, 310/313 C, 261; 333/150–155, 193–196

[56] References Cited

U.S. PATENT DOCUMENTS

| | | | |
|---|---|---|---|
| 3,956,646 | 5/1976 | Shibayama et al. | 310/313 A |
| 3,987,377 | 10/1976 | Kuroda | 310/313 A X |
| 3,995,240 | 11/1976 | Kerbel | 310/313 A X |
| 4,247,835 | 1/1981 | Lewis | 310/313 A |
| 4,323,809 | 4/1982 | O'Connell | 310/313 A |
| 4,472,656 | 9/1984 | Franx | 310/361 |
| 4,484,098 | 11/1984 | Cullen et al. | 310/313 A |
| 4,499,395 | 2/1985 | Kahan | 310/361 |
| 4,511,817 | 4/1985 | Chai et al. | 310/313 A |

Primary Examiner—Mark O. Budd
Attorney, Agent, or Firm—Sigalos & Levine

[57] ABSTRACT

A Quartz Crystal for surface acoustic wave device application defined by the Euler angles lambda ($\lambda$) equal about 45° and mu ($\mu$) equal about 55° with an acoustic wave propagation direction angle theta ($\theta$) equal plus about 10° to minus about 30°.

8 Claims, 4 Drawing Figures

DOUBLY ROTATED ORIENTATIONS OF CUT ANGLES FOR QUARTZ CRYSTAL FOR NOVEL SURFACE ACOUSTIC WAVE DEVICES

BACKGROUND OF THE INVENTION

This invention relates to an optimal acoustic wave propagation orientation on a quartz crystal for surface acoustic wave (SAW) applications including natural single-phase unidirectional transducers.

Surface acoustic wave technology for signal processing has produced a broad range of devices which are used typically in the VHF and UHF range and include filters, resonators, delay lines, convolvers, impedance elements and various other types of devices. Processes for preparing these devices are well known in the art and the device typically involves interdigitated electrodes.

The orientations for surface acoustic wave propagation for any given crystal are completely defined by the Euler angles, lambda, mu and theta. The first two angles lambda and mu, define the crystal cut and the third angle, theta, defines the direction of acoustic wave propagation in that cut. Thus, acoustic wave propagation orientation in the crystal is defined by a unique set of all three Euler angles. See Holstein, H., *Classical Mechanics*, New York, (1950) (Addison-Wesley).

A theoretical tabulation of surface acoustic wave propagation properties at various orientations for a variety of surface wave materials and particular crystal cuts of interest can be generated and tabulated. A tabulation including velocity, coupling coefficient, electromechanical powerflow, angle curves, and magnitude and phase of the free surface mechanical displacements and electric surface potential can be found in *Microwave Acoustic Handbook IA and 2*, Slobodnik et al, Air Force Cambridge Research Labs, October 1973 and October 1974. Such data as set forth in these handbooks can be used as a guide to selecting appropriate directions for wave propagation and orientation in the crystal.

The concern in each case in the prior art is to find a crystal orientation which has good coupling between the voltage on the electrodes and the acoustic wave in the crystal itself, low beam steering, and good temperature stability. Applicant has discovered that a quartz crystal having a cut defined by the Euler angles of lambda equal about 45°, mu equal about 55° and theta equals plus about 10° to minus about 30°, an orientation which has not been heretofor disclosed, provides the needed advantages as set forth above when electrodes are placed on a quartz crystal and in addition, allows the construction of a two electrode per wavelength transducer with unidirectional characteristics. It also allows the construction of a two electrode per wavelength transducer with a desired symmetrical input conductance function and a flat susceptance region. See U.S. Pat. No. 4,599,587, issued July 8, 1986 and entitled *Impedance Element* for a detailed description of the desired conductance and susceptance.

Thus it is an object of the present invention to provide a quartz crystal having a substantially planar surface defined by the Euler angles lambda equal about 45° and mu equal about 55°, and the direction of propagation defined by the angle theta equal plus about 10° to minus about 30°.

It is also an object of the present invention to form a surface acoustic wave device comprising two interdigitated electrodes per wavelength on the planar surface of the quartz crystal having a planar surface defined by the Euler angles lambda equal about 45° and mu equal about 55°, and the direction of propagation defined by the Euler angle theta equal plus about 10° to minus about 30°.

It is still a further object of the present invention to provide the crystal with Euler angles of lambda equal about 45°, mu equal about 55° and theta equal plus about 10° to minus about 30° in the form of a wafer for constructing surface acoustic wave devices.

DESCRIPTION OF THE PREFERRED EMBODIMENT

These and other objects of the present invention will be described more completely in conjunction with the accompanying drawings in which:

FIG. 1 is a representation of the Euler angle of lambda ($\lambda$) and the direction in which it is moved a distance equal about 45° in forming the crystal of the present invention;

FIG. 2 is a representation of the Euler angle lambda in its moved position and the Euler angle mu and the direction it is moved equal about 55°;

FIG. 3 is a representation of the Euler angle theta or the direction of acoustic wave propagation in the cut crystal in a direction equal plus about plus 10° to about minus 30°; and FIG. 4 illustrates the side view of a surface acoustic wave device having two interdigitated electrodes per wavelength on the planar surface and having the quartz crystal cut with the Euler angles of lambda equal about 45° and mu equal about 55° and the direction of propagation Euler angle theta equal plus about 10° to minus about 30°.

DESCRIPTION OF THE DRAWINGS

The newly discovered crystal cut with the Euler angles lambda equal about 45° and mu equal about 55° and the wave propagation direction theta equal plus about 10° to minus about 30° on a quartz crystal provides improved performance of surface acoustic wave (SAW) devices. There are many different types of quartz crystal substrates which are usually cut in the form of wafers which are thin slices having two substantially planar surfaces with at least one of the planar surfaces cut with a particular orientation that gives a cut having desired features including temperature stability of frequency and delay, velocity, coupling coefficient, and the like. The surface of the crystal on which the electrodes are to be placed is made flat and smooth before the electrodes are placed upon it.

SAW devices are used for a large number of applications including impedance elements, resonator, coupled resonators filters and the like. It is important that the crystal be cut such that good coupling exists between the voltage on the electrodes and the acoustic waves in the crystal itself. The crystal should have low beam steering and good temperature stability. The orientations for surface acoustic wave propagation for any given crystal are completely defined by the Euler angles lambda ($\lambda$), mu ($\mu$), and theta ($\theta$). The first two angles, lambda and mu, define the crystal cut and the third angle, theta, defines the direction of acoustic wave propagation on that cut. Thus acoustic wave propagation orientation in the crystal is defined by a unique set of Euler angles. Various surface acoustic wave propagation properties exist at various orientations for a variety of surface wave materials in particular crystal cuts of interest. These properties include velocity, coupling coefficient, electromechanical power flow angle, magnitude and phase of the free surface mechanical displacements and the electric surface potential. In addition other properties include the temperature coefficient of delay, spurious bulk responses, diffractioned characteristics, dielectric constants and the like.

Figure 1:
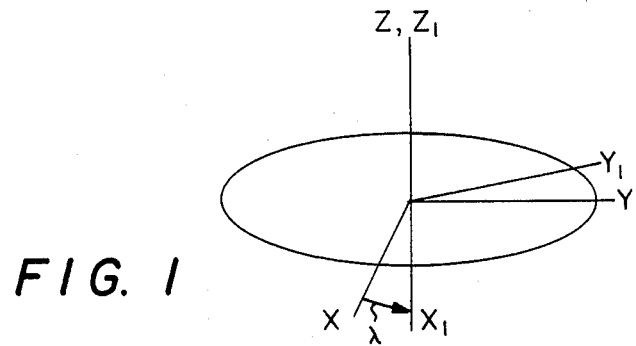
FIG. 1 illustrates the plane of the crystal in which the Euler angle lambda, equal about 45°, and the direction it is to be moved in the present invention from X to $X_1$ for the proper crystal cut.
Figure 2:
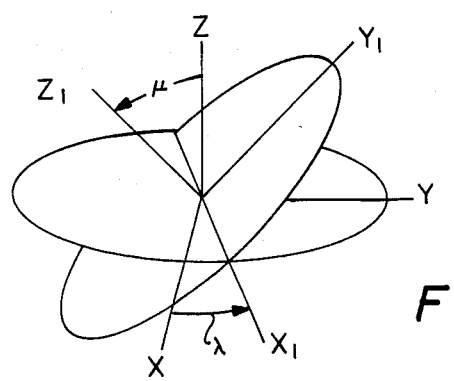
FIG. 2 illustrates the manner in which the Euler angle mu, equal about 55°, must be moved in the present invention from Z to $Z_1$, in order to form the proper crystal cut of the present invention.
Figure 3:
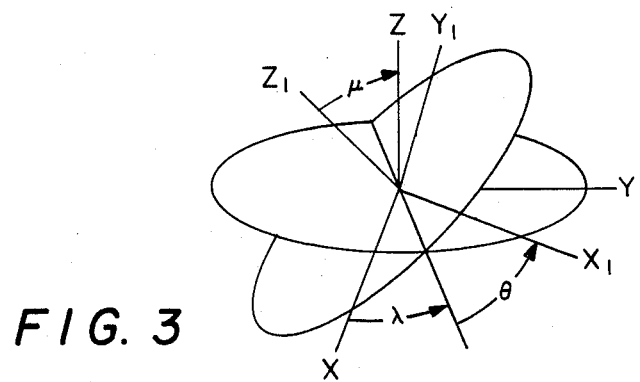
FIG. 3 illustrates the Euler angle theta equal plus about 10° to minus about 30°, which represents the direction of wave propagation in the crystal when cut according to the angles lambda and mu shown in FIGS. 1 and 2.
Figure 4:
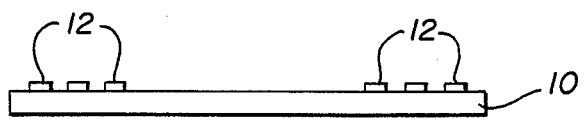
FIG. 4 illustrates the quartz crystal 10 with the novel acoustic wave propagation orientation on the cut of plus about 10° to minus about 30° and illustrates two electrodes 12 per wavelength placed thereon to form the novel acoustic wave device of the present invention which has unidirectional wave propagation characteristics. The transducer has a symmetric conductance function and can have a flat susceptance region. This structure can be obtained because the separation of the centers of the transduction and reflection on the newly discovered orientation is approximately 45°, the desired separation as set forth in U.S. Pat. No. 4,599,587 entitled *Impedance Element.*

Thus a quartz crystal has been disclosed which has substantially planar surfaces defined by particular Euler angles including lambda equal about 45°, and mu equal about 55° with a wave propagation direction theta equal plus about 10° to minus about 30°. The novel orientation allows a good coupling coefficient between the voltage on the electrodes placed thereon and the acoustic waves in the crystal itself and has low beam steering and good temperature stability and allows a unidirectional transducer to be constructed.

While the invention has been described in connection with a preferred embodiment, it is not intended to limit the scope of the invention to the particular form set forth but, on the contrary it is intended to cover such alternatives, modification and equivalents as may be included in the spirit and scope of the invention as defined by the appended claims.

I claim:

1. A quartz crystal for acoustic wave propagation having a substantially planar surface defined by the Euler angles lambda ($\lambda$) equal about 45° and mu ($\mu$) equal about 55° and the acoustic wave propagation direction Euler angle theta ($\theta$) equal plus about 10° to minus about 30°.

2. A unidirectional surface acoustic wave device comprising two interdigitated electrodes per wavelength on the planar surface of the quartz crystal defined by the Euler angles of claim 1 to obtain unidirectional transmission.

3. The device of claim 2 in which the crystal is in the form of a wafer.

4. A crystal for acoustic wave propagation comprising a thin quartz plate having a doubly rotated crystallographic orientation around (1) the Z-axis of said plate by an angle lambda ($\lambda$) of about 45° and (2) the X-axis of said plate by an angle mu ($\mu$) of about 55° and a wave propagation angle theta ($\theta$) of about plus 10° to minus about 30°.

5. A method of forming a quartz crystal for acoustic wave propagation comprising the steps of:
   a. forming a cut quartz crystal having a substantially planar surface, and
   b. defining the planar surface by the Euler angle lambda ($\lambda$) equal about 45° and mu ($\mu$) equal about 55° and the acoustic wave propagation direction Euler angle theta ($\theta$) equal plus about 10° to minus about 30°.

6. A method of forming a unidirectional surface acoustic wave device comprising the steps of:
   a. forming a cut quartz crystal having a substantially planar surface,
   b. defining said crystal by the Euler angles lambda ($\lambda$) equal about 45°, mu ($\mu$) equal about 55° and theta ($\theta$) equal about plus 10° to minus 30°, and
   c. placing two interdigitated electrodes per wavelength on said planar surface, to propagate acoustic waves in the direction theta ($\theta$) equal plus about 10° to minus about 30° to obtain said unidirectional transmission.

7. The method of claim 6 further comprising the step of constructing said crystal in the form of a wafer.

8. The method of forming a crystal cut comprising the steps of:
   a. forming said crystal of a thin quartz plate, for acoustic wave propagation
   b. rotating the crystallographic orientation of said plate around (1) the Z-axis of said plate by an angle lambda ($\lambda$) equal about 45° and (2) the X-axis of said plate by an angle mu ($\mu$) equal about 55°, and
   c. designating the acoustic wave propagation direction in said crystal as an angle theta ($\theta$) equal plus about 10° to minus about 30°.

* * * * *